United States Patent
Ueno

(10) Patent No.: US 6,948,944 B2
(45) Date of Patent: Sep. 27, 2005

(54) WIRING BOARD WITH BUILT-IN ELECTRONIC COMPONENT AND METHOD FOR PRODUCING THE SAME

(75) Inventor: Yukihiro Ueno, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/287,539

(22) Filed: Nov. 5, 2002

(65) Prior Publication Data

US 2003/0087538 A1 May 8, 2003

(30) Foreign Application Priority Data

Nov. 5, 2001 (JP) ........................................ 2001-339837

(51) Int. Cl.[7] ............................ H01R 12/00; H05K 1/00
(52) U.S. Cl. ............................. 439/68; 439/67; 439/71
(58) Field of Search ........................... 439/68, 67, 71; 361/836; 174/262

(56) References Cited

U.S. PATENT DOCUMENTS

| | | | | |
|---|---|---|---|---|
| 359,159 A | * | 3/1887 | Jones | .......................... 222/561 |
| 3,728,661 A | * | 4/1973 | Kassabgi | ..................... 439/493 |
| 4,530,552 A | * | 7/1985 | Meehan et al. | ................ 439/68 |
| 4,647,666 A | * | 3/1987 | Larock | ......................... 546/141 |
| 4,652,117 A | * | 3/1987 | Kogane et al. | ............... 355/72 |
| 5,805,431 A | * | 9/1998 | Joshi et al. | .................. 361/836 |
| 6,424,233 B1 | * | 7/2002 | Tonegawa et al. | .......... 333/133 |
| 2003/0114022 A1 | * | 6/2003 | Franzen et al. | ............... 439/67 |

FOREIGN PATENT DOCUMENTS

| | | |
|---|---|---|
| JP | 05-327228 A | 12/1993 |
| JP | 06-120671 A | 4/1994 |
| JP | 06-314859 A | 11/1994 |
| JP | 07-283335 A | 10/1995 |

* cited by examiner

Primary Examiner—Chandrika Prasad
(74) Attorney, Agent, or Firm—Birch, Stewart, Kolasch & Birch, LLP

(57) ABSTRACT

A built-in electronic component-mounted wiring board includes an electronic component having a connecting terminal and being mounted on a support; an insulating layer provided on the support so as to cover at least a portion of the electronic component; an opening provided in the insulating layer so as to expose the connecting terminal of the electronic component; and a connecting portion provided in the opening.

12 Claims, 9 Drawing Sheets

WIRING BOARD WITH BUILT-IN ELECTRONIC COMPONENT AND METHOD FOR PRODUCING THE SAME

This nonprovisional application claims priority under 35 U.S.C. § 119(a) on Patent Application No. 2001-339837 filed in JAPAN on Nov. 5, 2001, which is herein incorporated by reference.

BACKGROUND OF THE INVENTION

1. Field of the Invention

The present invention relates to a wiring board used for an electronic device, and in particular to a wiring board with a built-in electronic component and a method for producing the same.

2. Description of the Related Art

FIG. 15 is a cross-sectional view of a general printing wiring board 110 provided with an electronic component 104.

The printing circuit board 110 includes a support member 101 formed of an insulating resin and a conductive pattern 102. The conductive pattern 102 is produced by forming a conductive layer made of, for example, copper foil on the support member 101 and then etching the conductive layer. The printing circuit board 110 includes a solder resist layer 103 provided on the support member 101 and on the conductive pattern 102. On the conductive pattern 102, the solder resist 103 is provided except for areas on which the solder resist 103 is not necessary for the purpose of connection with the electronic component 104 or electric or physical connection with other components, or for other purposes. The electronic component 104 is mounted on the solder resist layer 103. A terminal 105 is provided on a side surface of the electronic component 104. A part of the terminal 105 is an electronic component-mounting land (i.e., a part of the conductive pattern 102), and the terminal 105 and the electronic component-mounting land are connected to each other via a solder member 106.

In the example shown in FIG. 15, only one conductive layer is provided on the support member 101 such that the conductive pattern 102 is provided on only one surface of the support 101 for the simplicity of explanation. A multi-layer printing wiring board including a multi-layer conductive pattern formed of a plurality of conductive layers is in wide use.

A wiring board with a built-in electronic component is produced by the following two methods based on the structure shown in FIG. 15 including the printing wiring board 110 and the electronic component 104. (1) A spacer is bonded to an area of the printing wiring board 110 where the electronic component 104 is not provided, and a resin plate is bonded to the spacer so as to cover the electronic component 104. (2) The printing wiring board 110 and the electronic component 104 are molded together with a resin.

FIG. 16 is a cross-sectional view of a wiring board with a built-in electronic component which is disclosed in Japanese Laid-Open Publication No. 2001-53447. The wiring board with a built-in electronic component includes a support member 201 formed of an insulating resin or a multi-layer printing wiring board and an accommodating section 202 for accommodating an electronic component 104 in the support member 201. The accommodating section 202 is provided in an upper portion of the support member 201 or in the entirety of the thickness direction of the support member 201. The electronic component 104 is accommodated in the accommodating section 202. A top surface of the electronic component 104 is on the same level as a top surface of the support member 201. An insulating resin layer 203 is provided on a surface of the electronic component 104, and a wiring pattern 204 is provided on the insulating resin layer 203. A terminal 105 of the electronic component 104 and the wiring pattern 204 are electronically connected to each other via a through-hole provided in the insulating resin layer 203. The through-hole is formed by the same method as a laser method which is used for producing a build-up wiring plate.

FIG. 17 is a cross-sectional view of another exemplary wiring board with a built-in electronic component. The wiring board with a built-in electronic component includes a printing wiring board 110 including a support member 101, and a conductive pattern 102 and a solder resist layer 103 provided on the support member 101 as in the example shown in FIG. 15. The wiring board with a built-in electronic component shown in FIG. 17 further includes an electronic component 301 provided on the printing wiring board 110 by printing. The electronic component 301 is formed of, for example, a conductive paste or a dielectric paste, and is provided on the conductive pattern 102 by printing. The electronic component 301 is covered with an insulating resin layer 302 printed on the entire surface of the printing wiring board 110. The insulating resin layer 302 covers the electronic component 301 and also prevents shortcircuiting between the electronic component 301 and other elements.

FIG. 18 is a cross-sectional view of a wiring board with a built-in electronic component, in which the wiring board has a heat dissipation function. The wiring board with a built-in electronic component includes a metal core substrate 401. Both a top surface and a bottom surface of the metal core substrate 401 are covered with an insulating resin layer 402. On the insulating resin layer 402 on both surfaces of the metal core substrate 401, an electronic component-mounting land as a part of a conductive pattern 102 and a solder resist layer 103 are provided. An electronic component 104 is provided on the solder resist layer 103 on the top surface of the metal core substrate 401. A terminal of the electronic component 104 is connected to the electronic component-mounting land via a solder member 106. The conductive pattern 102 on the top surface of the metal core substrate 401 and the conductive pattern 102 on the bottom surface of the metal core substrate 401 are electrically connected to each other via a through-hole 403.

The electronic component 104 mounted on the metal core substrate 401 generates a large amount of heat. The metal core substrate 401 is used in the case where, for example, (1) the heat of the electronic component 401 is not dissipated sufficiently quickly by a usual method, (2) there is no space for accommodating a large heat sink, and (3) the rigidity of a resin substrate is not sufficient for carrying a heavy electronic component that is to be mounted.

The above-described conventional devices have the following problems.

In the wiring board with a built-in electronic component shown in FIG. 15, the electronic component 104 mounted on the general printing wiring board 110 is covered with a resin plate, or molded with a resin or the like together with the printing wiring board 110. When a great number of electronic components 104 are mounted at high density with this structure, there is a possibility that no space results for the provision of a spacer. In the structure obtained by molding with a resin or the like, the heat dissipation efficiency from the electronic component 104 is possibly deteriorated. Accordingly, the structure obtained by covering the electronic device with a resin plate or molding the electronic device is used, for example, for improving the ease of handling the wiring board, for forming the circuit as a black box, or for increasing the shock resistance.

This structure with a plurality of electronic components is obtained by mounting an additional electronic component on the printing wiring board 110 which already has an electronic component 104, or by electrically connecting the electronic components 104 mounted on the printing wiring board 110 to other elements and the like. In such a stage of production, soldering is performed. Solder reflow or the like caused by soldering re-heats and thus re-melts the solder member 106, for solder-connecting the terminal of the electronic device 104 to the electronic component-mounting land. As a result, the electronic device 104 may possibly come off from the printing wiring board 110. In addition, the solder used here, which is formed of a heavy metal or the like, is hazardous to the environment.

In the case of the wiring board with a built-in electronic component shown in FIG. 16, it is necessary to size the accommodating section 202 precisely in accordance with the size of the electronic component 104, which is quite difficult. Especially in the case where a printing wiring board is used as the support member 201, the accommodating section 202 is not formed by molding or the like. Therefore, the accommodating section 202 needs to be formed in each printing wiring board. Usually, several tens or several hundreds of electronic components 104 are mounted in one wiring board. It is practically impossible to form the accommodating sections 202 for all of the electronic components 104.

The electronic components 104 have different heights depending on the type, and even the same type of electronic components 104 are uneven in size. It is very difficult to form the accommodating sections 202 such that the top surfaces of all the electronic components 104 are at the same level as the top surface of the support member 201.

In the case where a printing wiring board is used as the support member 201, the accommodating section 202 formed in accordance with the size of the electronic component 104 prevents formation of the conductive pattern 204 at the location of the accommodating section 202. Considering that the insulating capability of the insulating resin layer 203 is lowered in the vicinity of the accommodating section 202, the conductive pattern 204 needs to be distanced to some extent from the accommodating section 202. In this case, the density of the conductive pattern 204 is significantly lowered. Today, electronic components are often designed to be mounted at an interval of several millimeters or less. With such a design, it is difficult to form the accommodating sections 202, much less to form the conductive pattern 204 between the accommodating sections 202. The insulating resin layer 203 is removed using laser light, drilling or the like. Such removal needs to be performed with a high level of control in order to prevent damaging the terminal 105 of the electronic component 104.

In the case where a printing wiring board is used as the support member 201, the thickness of the electronic component 104 is usually greater than the thickness of the printing wiring board. Therefore, the electronic component 104 actually passes through the accommodating section 202 in the printing wiring board, rather than being built in the printing wiring board. The electronic component 104 in this state is not sufficiently stable in terms of electronic connection or mounting state.

Accordingly, the structure shown in FIG. 16 is actually used for specific purposes, for example, for lowering the projecting height of the electronic component mounted on the printing wiring board. This is performed with the sacrifice of lower wiring density and the cost for producing a special-shape element.

The structure shown in FIG. 17 has the advantages that incorporation of the electronic component 301 does not significantly increase the total thickness of the wiring board and even re-heating by solder reflow or the like does not cause the electronic component 301 to come off. However, the electronic component 301 which can be mounted is limited to a printable component. Accordingly, the structure shown in FIG. 17 is actually usable only for, for example, a resistor formed of carbon or a capacitor having a very small capacitance. Production of the electronic components 301 by printing a paste is not practical for the following reasons. Even with the same designed size and thickness, the electronic components 301 actually produced are quite dispersed in size and thickness. Moreover, the heat used for soldering the electronic components 301 further varies and thus further disperses the size and thickness thereof.

With the structure shown in FIG. 18 in which the metal core substrate 401 is used as the support, the entire surface of the metal core substrate 401 and the inner wall of the through-hole 403 need to be completely covered with the insulating resin layer 402 because the metal core substrate 401 is conductive. However, it is difficult to completely cover the inner wall of the through-hole 403. It is also difficult with this structure to form small-diameter through-holes and provide a multi-layer signal wiring layer in order to increase the wiring density. Even when the multi-layer signal wiring layer is provided, the layer is provided between the electronic component 104 and the metal core substrate 401, which significantly spoils the heat dissipation efficiency.

SUMMARY OF THE INVENTION

According to one aspect of the invention, a built-in electronic component-mounted wiring board includes an electronic component having a connecting terminal and being mounted on a support; an insulating layer provided on the support so as to cover at least a portion of the electronic component; an opening provided in the insulating layer so as to expose the connecting terminal of the electronic component; and a connecting portion provided in the opening.

In one embodiment of the invention, a top surface of the insulating layer is substantially at the same level as or lower than that of a top surface of the electronic component with respect to the support with respect to the support.

In one embodiment of the invention, the insulating layer is provided on a portion of the support, the portion having the electronic component thereon.

In one embodiment of the invention, an area and a position of the opening in the insulating layer are set in accordance with a desired function and characteristic of the electronic component.

In one embodiment of the invention, the built-in electronic component-mounted wiring board further includes a metal layer for covering a laminate including the support, the insulating layer, and the electronic component, except for a portion through which the laminate is connectable to an external device.

In one embodiment of the invention, the built-in electronic component-mounted wiring board further includes a metal layer having a heat dissipating function on a laminate including the support, the insulating layer and the electronic component except in a position of the connecting terminal.

In one embodiment of the invention, the support is formed of a layer of a material which is different from a material of the insulating layer or a plurality of layers of a material different from the insulating layer material.

According to another aspect of the invention, a method for producing a built-in electronic component-mounted wiring board includes the steps of mounting an electronic component on a support; forming an insulating layer on the support so as to cover at least a portion of the support; and forming an opening in the insulating layer so as to expose a connecting terminal of the electronic component.

In one embodiment of the invention, the method further includes the step of metallizing a laminate including the support, the insulating layer and the electronic component after the opening is formed, thereby forming a connecting portion in the opening, which is electrically connected to the connecting terminal of the electronic component. Alternatively, the method further includes the steps of metallizing a laminate including the support, the insulating layer and the electronic component after the opening is formed, thereby forming a conductive layer in the opening and on the insulating layer; and etching the conductive layer, thereby forming a connecting portion in the opening and a wiring pattern which is electrically connected to the connecting terminal of the electronic component via the connecting portion.

In one embodiment of the invention, the insulating layer is formed of a photosensitive material, and the opening in the insulating layer is formed by developing the insulating layer by supplying light thereto.

According to the present invention, the electronic component is partially or entirely covered with an insulating layer and thus is improved in shock resistance. An electronic component mounted on a support formed of a resin plate, a metal plate, a printed wiring board, or the like can be electrically connected to a wiring layer or another electronic component in the opening of the insulating layer.

The electronic component or the wiring layer and another electronic component can be electrically connected to each other via a connecting portion provided in the opening of the insulating layer by use of a metallizing processing, such as, for example, plating or sputtering, instead of conventional metal soldering or the like. Therefore, the reliability of the connection of the electronic component can be improved including the heat resistance. Environmentally hazardous materials are not used for electrically connecting an electronic component. This is preferable, for example, for the environment and the health of operators. Unlike in the conventional art, it is not necessary to provide an accommodating section, in a support, such as a hole or recess for accommodating an electronic component. Thus, the wiring density is not lowered. Any type of electronic components can be put into a built-in state, not only electronic components formed by printing.

The connecting portion of the electronic component is formed so as to reach the level of the top surface of the insulating layer by metallizing processing. Thus, the connectability between the electronic component and the wiring layer or another electronic component can be improved. The electric connection between the wiring layer and the electronic component may be performed in the same step as the formation of a wiring pattern on the insulating layer which is provided on the electronic component. In this case, the connectability can easily be improved by significantly changing the production steps of the wiring board.

In the case where the light irradiation and development is performed using a photosensitive resin for the insulating layer, a selected area of the insulating layer can be removed so as to form an opening in the insulating layer.

The insulating layer can be formed such that the top surface thereof is substantially at the same level as the top surface of the electronic component. The electronic component may be formed so as to be buried in the insulating layer in order to flatten the surface of the wiring board. Therefore, unlike the conventional art, the electronic component is not put into the state of hanging in the hole of the wiring board. Thus, the stability of the connection and mounting is improved. The insulating layer may be provided so as to cover the entirety of or a part of the electronic component. For example, a portion to which a connector cable is to be inserted, an adjustment pinch of a trimmer volume, or the like is exposed, and the top surface of the electronic component and a part of the surface is exposed from the insulating layer. In the case where the photosensitive resin layer is provided on a part of the substrate, not on the entire surface of the substrate, a part of the electronic component is accordingly exposed from the insulating layer.

In the case where the insulating layer is formed only on a part of the support, on which an relevant electronic component is also provided, the production cost of the built-in electronic component-mounted wiring board is reduced and the rigidity thereof is improved.

In the step of partially removing the insulating layer so as to form the opening in the insulating layer, the area and position of the opening, i.e., the connecting portion between the electronic component and the wiring layer, can be adjusted. Thus, the function and characteristics of the electric circuit can be changed.

Depending on the physical properties of the support and the mounting method of the electronic component, new functions, which are not provided in the conventional wiring board, such as heat dissipation, temperature control, and formation of a magnetic circuit, can be added. For example, the wiring layer except for a portion through which the wiring layer is connectable to an external device can be covered with a metal layer by metallizing processing, such as plating or the like. In this case, an electric function such as shielding or provision of an antenna can be realized. By forming such a metal layer for each of circuit blocks, the influence exerted on other circuits by external noise and noise generated in each circuit block can be minimized.

A metal layer having a heat dissipation layer may be provided on the electronic component except for a connecting terminal thereof. This metal layer may be formed in the same step as, but independently from, the formation of a wiring pattern. The metal layer is formed so as to be in contact with the electronic component except for the connecting terminal. Another substance may be provided between the electronic component and the metal layer.

The support may be formed of a layer of material having a physical property different from that of the material of the insulating layer or other main elements, or a plurality of layers of such a material. By using, for example, a highly heat-conductive material for the support, the heat dissipation effect can be provided. In this case, the heat-conductive body can be formed of, for example, a metal plate or a metal plate having an insulated surface. By providing another substance between a part of, or all of, the mounted electronic components and the heat-conductive body, the temperature of the plurality of electronic components is controlled so as to reduce the temperature difference among the electronic components, or the temperature of each electronic component is controlled to be within an appropriate range in order to stably operate the circuit.

The support may be formed of metal or other conductive materials. Thus, the functions of a power supply layer, a ground layer, or a shield layer can be provided. The support may be formed of a material having a superior physical property, for example, high rigidity and high strength, or a low heat expansion coefficient or a low moisture coefficient. In this case, the physical characteristics, such as strength of the entire wiring board, size stability, heat resistance and the like, can be improved. By forming the support of a ferromagnetic material, a magnetic circuit can be formed of the support, the wiring layer and the electronic component mounted on the support.

Thus, the invention described herein makes possible the advantages of providing a wiring board with a built-in electronic component and a method for producing the same, by which the electronic component is built in the wiring board without producing a specific type of electronic component, a wiring pattern and the electronic component are easily and stably connected to each other in a small area, and the wiring density and the heat dissipation efficiency are prevented from being lowered.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

Figure 1:
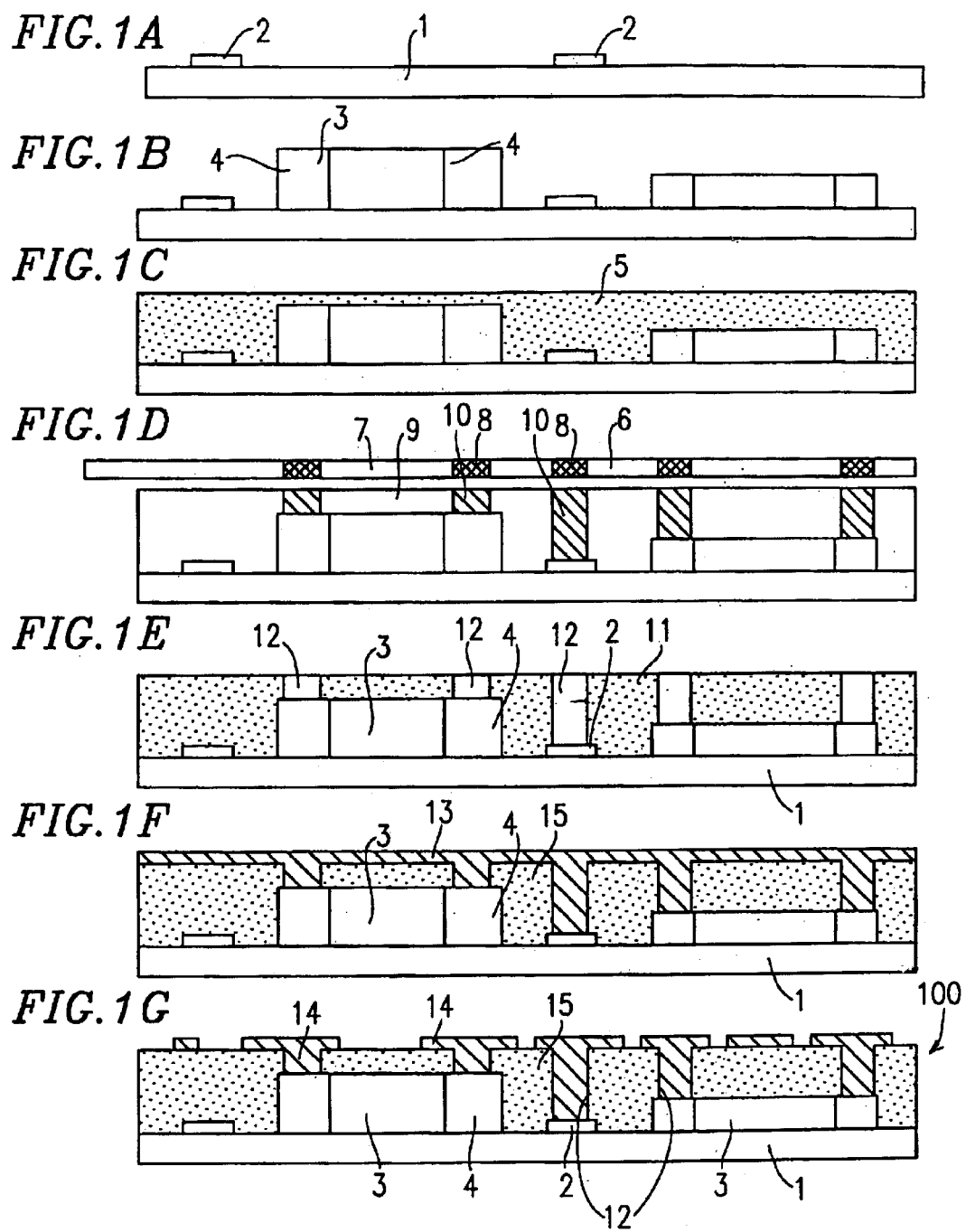
FIGS. 1A through 1G are cross-sectional views illustrating steps for producing a built-in electronic component-mounted wiring board according to a first example of the present invention.

FIGS. 1A through 1G are cross-sectional views illustrating steps for producing a wiring board 100 with a built-in electronic component (hereinafter, referred to as the "built-in electronic component-mounted wiring board 100) according to a first example of the present invention. FIG. 1G shows a completed state of the built-in electronic component-mounted wiring board 100.

As shown in FIG. 1G, the built-in electronic component-mounted wiring board 100 includes a flat plate core (support) 1, a wiring pattern 2 provided on the core 1, and various electronic components 3 provided on the core 1. In this example, two electronic components 3 having different heights are provided on the core 1. The electronic components 3 are provided on a surface of the core 1, not on a land of the wiring pattern 2 or the like.

The built-in electronic component-mounted wiring board 100 includes an insulating layer 15 provided on the entire surface of the core 1 so as to cover the electronic components 3 and the wiring pattern 2. The insulating layer 15 has a flat top surface. The insulating layer 15 has openings 12. The openings 12 are formed by removing a portion of the insulating layer 15 above a connecting terminal 4 of each electronic component 3 and a portion of the insulating layer 15 above prescribed areas of the wiring pattern 2. The built-in electronic component-mounted wiring board 100 further includes a wiring pattern 14 provided on the insulating layer 15 so as to fill the openings 12. The wiring pattern 14 is electrically connected to the connecting terminal 4 of each electronic component 3 and to the wiring pattern 2 on the core 1 through the respective opening 12.

A method for producing the built-in electronic component-mounted wiring board 100 will be described with reference to FIGS. 1A through 1G. In this example, the electronic components 3, the insulating layer 15 and the wiring pattern 14 are provided on a top surface of the core 1. The electronic components 3, the insulating layer 15 and the wiring pattern 14 may also be provided on a bottom surface of the core 1 by the same procedure. In addition, a wiring layer may be added to the structure shown in FIG. 1G by a build-up method. FIG. 1G only shows the wiring pattern 2 as an outer pattern provided on the core 1 and omits an inner pattern of the core 1, for the simplicity of explanation.

As shown in FIG. 1A, the core 1, having the wiring pattern 2 as an outer pattern on at least one surface thereof, is provided. The core 1 is formed of, for example, a printing wiring board with the inner pattern printed on one surface thereof, a multi-layer printed wiring board, or an insulating resin board.

As shown in FIG. 1B, the electronic components 3 are mounted on the core 1. The electronic components 3 are bonded to the surface of the core 1 by an adhesive so as to fix the position thereof, like typical electronic components. The electronic components 3 each have the connecting terminal 4 on both side ends thereof.

In this example, each electronic component 3 is a rectangular parallelepiped, both side ends of which are metallized to be the connecting terminals 4. The electronic components are not limited to this type, and any type of electronic components for mounting are usable. An electronic component having a non-metal surface, formed of a carbon paste or the like is also usable as the electronic component 3 as long as it is subjected to appropriate metallization.

The core 1 does not need to be pre-processed for mounting the electronic components 3. In this example, after the electronic components 3 are mounted, the insulating layer 15 is provided and then a wiring layer is provided as described below. Owing to such a structure, a solder resist layer is not provided. In this example, the wiring pattern 2 is provided on the surface of the core 1. The wiring pattern 2 is not necessary when it does not need to be electrically connected to the wiring pattern 14 provided on the insulating layer 15.

Figure 2:
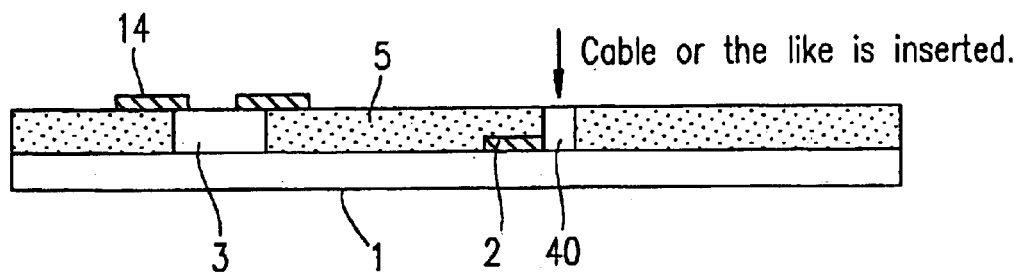
FIG. 2 is a cross-sectional view of another built-in electronic component-mounted wiring board according to the first example of the present invention.

After the electronic components 3 are mounted, as shown in FIG. 1C, a photosensitive resin layer 5, which is to be the insulating layer 15 (inter-level insulating layer between signal wiring layers), is formed on the entire surface of the core 1 so as to cover the electronic components 3 and the wiring pattern 2. In this example, the photosensitive resin layer 5 is formed on the entire surface of the core 1. Alternatively, as shown in FIG. 2, the photosensitive resin layer 5 may be formed so as to expose a surface of each electronic component 3 such that the surface of the electronic component 3 is at the same level as the photosensitive resin layer 5. In this case, the wiring pattern 14 can be formed on the surface of the electronic component 3/photosensitive resin layer 5. The electronic components 3 are electrically connected to an external element via the core 1 and the wiring pattern 2 (land) by a cable or the like inserted through a connector 40, which is formed in the photosensitive resin layer 5.

In this example, the photosensitive resin layer 5 is formed of an epoxy-based resin provided with photosensitivity. The photosensitive resin layer 5 is exposed to light so as to be changed from a liquid state into a solid state by photopolymerization as described below. A portion of the photosensitive resin layer 5 which is not exposed to light remains liquid and thus can be washed away by developing. Instead of the epoxy-based resin, a photosensitive polyimide resin or the like may be used, depending on the electric characteristics and the level of heat-resistance required for the built-in electronic component-mounted wiring board 100.

As shown in FIG. 1D, the photosensitive resin layer 5 is exposed and developed using a photomask 6. The photomask 6 is transparent (light transmissive) in areas corresponding to the areas of the photosensitive resin layer 5 which are to be cured, and is black (i.e., non-light transmissive) in areas corresponding to the areas of the photosensitive resin layer 5 which are not to be cured. The size of each of the areas which are not to be cured is preferably equal to or of a smaller diameter than the connecting terminal 4 of the electronic component 3. The photomask 6 is provided on the photosensitive resin layer 5 such that the black areas correspond to the connecting terminals 4, and then is exposed to light incident from above. Thus, the areas of the photosensitive resin layer 5 exposed to light (areas 9) are cured, and the areas not exposed to light (areas 10) are not cured.

Then, the entire laminate is washed with an appropriate solvent. As a result, as shown in FIG. 1E, the areas of the photosensitive resin layer 5 on the connecting terminals 4 and the wiring pattern 2 are selectively removed. Thus, the insulating layer 15 having the openings 12 for exposing a prescribed area of each connecting terminal 4 and a prescribed area of the wiring pattern 2 is formed.

In this example, the photosensitive resin layer 5 is formed of a positive photosensitive resin, which is cured when exposed to light. Alternatively, a negative photosensitive resin may be used. When the negative photosensitive resin is used, the light transmissive areas and the non-light transmissive areas of the photomask 6 are opposite to the above. In this example, areas of the insulating layer 15 are selectively removed by photolithography using the photosensitive resin layer 5. The openings 12 may be formed by providing a typical epoxy resin or the like instead of the photosensitive resin layer 5, and then selectively removing areas of the epoxy resin or the like above the connecting terminals 4 and the wiring pattern 2 using laser light, physical drilling, polishing or the like.

After the insulating layer 15 is formed, as shown in FIG. 1F, a conductive layer 13, which is to be the wiring pattern 14, is formed on the insulating layer 15. In this example, the conductive layer 13 is formed of copper.

The conductive layer 13 fills the openings 12 so as to be electrically connected to the connecting terminals 4. In this example, in order to obtain superb electric connection between the connecting terminals 4 and the conductive layer 13, so as to improve the activity of the surface of the connecting terminals 4, the entire laminate is washed with an acid solution before the conductive layer 13 is formed. Such pre-processing is not absolutely necessary, and may be performed depending on the properties of the connecting terminals 4.

Then, as in typical wiring boards, an etching resist layer is formed on the conductive layer 13, and the conductive layer 13 is patterned by etching, thereby forming the wiring pattern 14 as shown in FIG. 1G.

As described above, simultaneous with when the wiring pattern 14 is formed, the wiring pattern 14 can be electrically connected to the connecting terminals 4 of the electronic components 3 having different heights and to the wiring pattern 2 (land) with no electronic component provided thereon, with no special processing.

Even when a wiring layer is not provided on the wiring pattern 14, a solder resist layer is formed on the wiring pattern 14 and other necessary processing is performed. In this case also, a built-in electronic component-mounted wiring board is produced. On the solder resist layer, wiring layers can be produced by repeating the steps shown in FIGS. 1A through 1G, or repeating a build-up method of a photo-via system.

Figure 3A:
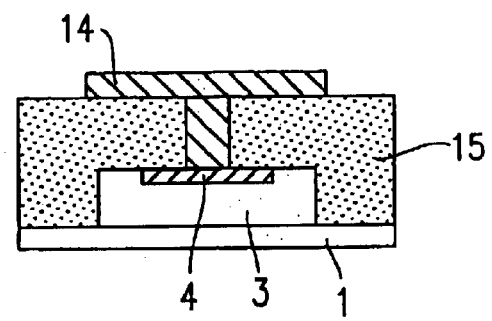
FIGS. 3A and 3B are cross-sectional views illustrating the shape of an insulating layer formed of a photosensitive resin and a metal layer acting as a connecting portion.
Figure 3B:
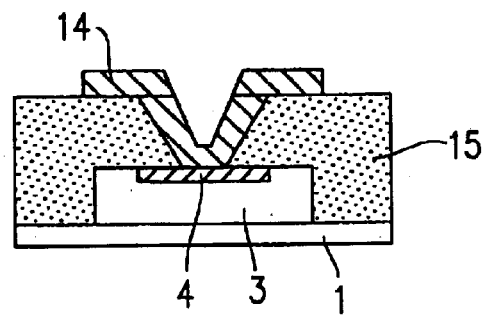

In this and the following examples, the openings 12 and the wiring pattern 14 in the openings 12 have the cross-section as shown in FIG. 3A. When the insulating layer 15 is formed of a photosensitive resin, the openings 12 have a tapered cross-section. Thus, the openings 12 and the wiring pattern 14 in the openings 12 often have a cross-section as shown in FIG. 3B. Still it is possible to realize the cross-section as shown in FIG. 3A by using a specific opening diameter, a specific plating solution, a specific plating method, or the like.

EXAMPLE 2

Figure 4:
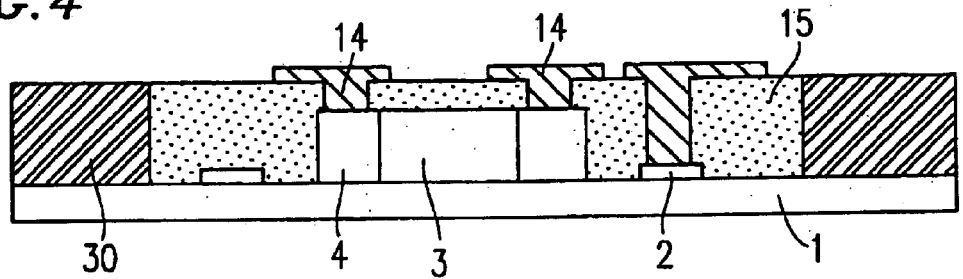
FIG. 4 is a cross-sectional view illustrating a structure of a built-in electronic component-mounted wiring board according to a second example of the present invention.

FIG. 4 is a cross-sectional view illustrating a structure of a built-in electronic component-mounted wiring board according to a second example of the present invention. In the first example, the insulating layer 15 is provided on the entire surface of the core 1. In the second example, the insulating layer 15 is provided only on the electronic components 3 and necessary areas of the core 1. On the remaining areas of the core 1, spacers 30 formed of a-resin plate are provided.

Owing to such a structure, the production cost of the built-in electronic component-mounted wiring board can be reduced, and the rigidity thereof can be increased. In the case where the built-in electronic component-mounted wiring board is punched out along a line within the spacers 30, a desired external shape is obtained without generating cracks or the like.

EXAMPLE 3

Figure 5:
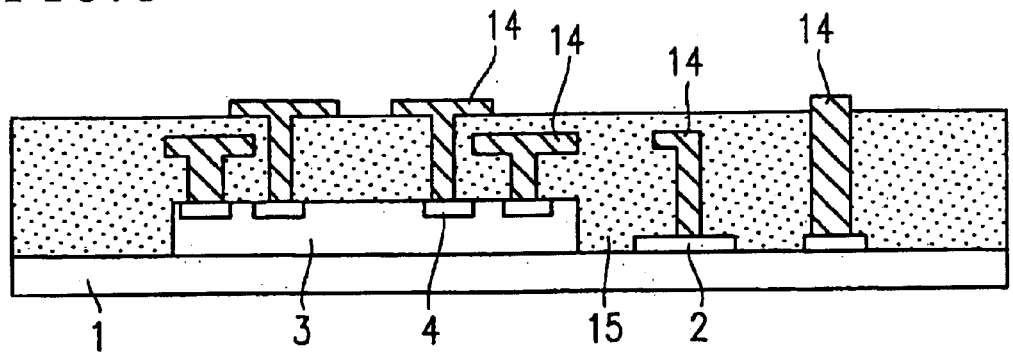
FIG. 5 is a cross-sectional view illustrating a structure of a built-in electronic component-mounted wiring board according to a third example of the present invention.

FIG. 5 is a cross-sectional view illustrating a structure of a built-in electronic component-mounted wiring board according to a third example of the present invention. In the first example, each electronic component 3 has a connecting terminal 4 on both side ends thereof. In the third example, the electronic component 3 has a plurality of connecting terminals 4 on one surface thereof, resulting in substantially the same shape as that of a BGA package without bumps.

The electronic component 3 having such a shape is provided on the core 1. As in the first example, the connecting terminals 4 and wiring patterns 14 are respectively connected to each other via openings 12 formed in an insulating layer 15. In the third example, there are a plurality of connecting portions between the connecting terminals 4 and the wiring patterns 14.

In this example, each of the connecting portions from the connecting terminal 4 to the wiring pattern 14 can have a diameter as small as equal to or less than the diameter of the connecting terminal 4. Accordingly, the width of the land, the wiring patterns or the like can be increased. Therefore, even when the number of pins is significantly larger as in recent devices, it is not necessary to form the wiring board with much precision, which contributes to reduction in the production cost and increase in yield. In this example, the openings 12 are formed in the insulating layer 15 using photo-polymerization. This technique is more appropriate than physical processing techniques, such as drilling, for example, for forming openings having a smaller diameter, for precisely controlling the depth of the openings, and for forming openings having different diameters in the same step.

Figure 6A:
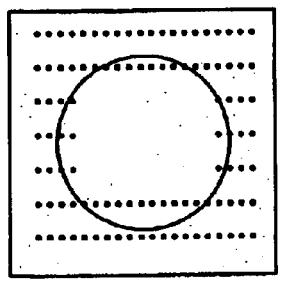
FIG. 6A shows a rear view of a BGA package.
Figure 6B:
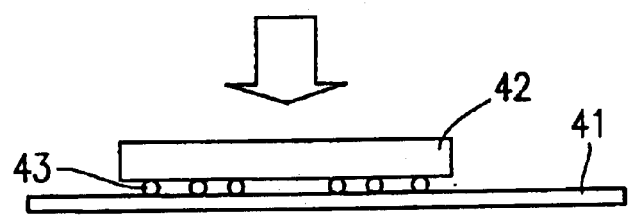
FIG. 6B is a cross-sectional view illustrating a step of mounting the BGA package on a substrate.

In the case where a BGA package or the like is mounted on the wiring board by a conventional method, the terminals (solder balls) are often melted or the contact often becomes unstable. There are many steps which need to be controlled, for example, pressure contact, melting, resin-sealing and the like. Thus, it is difficult to provide a reliable built-in electronic component-mounted wiring board. FIG. 6B shows the state where a BGA package 42 is provided on a substrate 41 and then solder balls 43 are supplied with heat and pressure so as to be melted such that the BGA package 42 is connected to the land on the substrate 41. In this state, it is not easy to uniformly apply the pressure and heat to the hundreds of solder balls 43 which are arranged in a lattice. FIG. 6A shows a BGA package in which a plurality of lines of terminals (solder bumps) are provided. The connection state of the terminals in an outer portion is relatively easily confirmed, and thus is relatively easily corrected. The connection state of the terminals in an inner portion (bumps in the area surrounded by the circle in FIG. 6A) cannot be easily confirmed or corrected. In this example, by contrast, all the connecting terminals can be electrically connected in a stable and uniform state easily owing to the metallization processing.

EXAMPLE 4

Figure 7A:
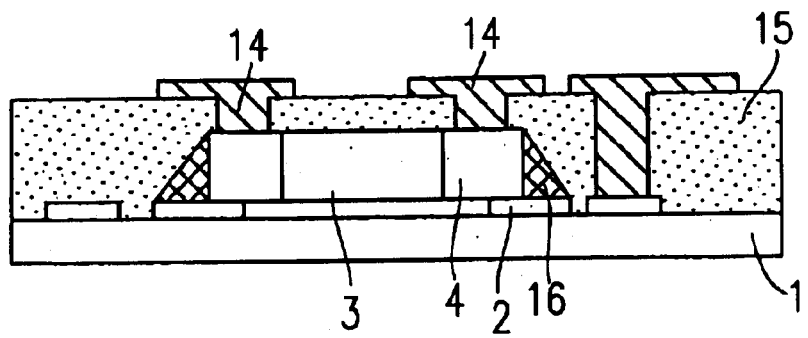
FIG. 7A is a cross-sectional view illustrating a structure of a built-in electronic component-mounted wiring board according to a fourth example of the present invention.

FIG. 7A is a cross-sectional view illustrating a structure of a built-in electronic component-mounted wiring board according to a fourth example of the present invention. In the fourth example, two adjacent wiring patterns 14 are connected to each other using a connecting terminal 4 which is connected to the wiring patterns 14.

In this example, the electronic component 3 is connected to the wiring pattern (land) 2 by solder 16 or other appropriate methods and is also connected to a wiring pattern (land) 14 on the insulating layer 15 by substantially the same steps as those in the first example. In this structure, the wiring pattern 2 and the wiring pattern 14 can be connected to each other in substantially the same area as that of the electronic component 3.

Figure 7B:
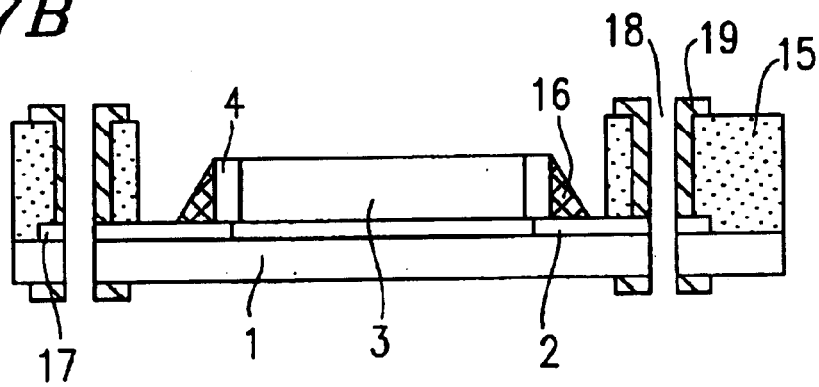
FIG. 7B is a cross-sectional view illustrating a structure of a conventional built-in electronic component-mounted wiring board having substantially the same connection state as that of FIG. 7A.

According to a conventional method, as shown in FIG. 7B, it is necessary to form a through-hole 18 in the insulating layer 15 outside a solder portion 16 and connect a through-hole land 17 in a lower wiring layer and a through-hole land 19 in an upper wiring layer to each other. Therefore, a larger area is required than by the method of the present invention shown in FIG. 7A.

EXAMPLE 5

Figure 8A:
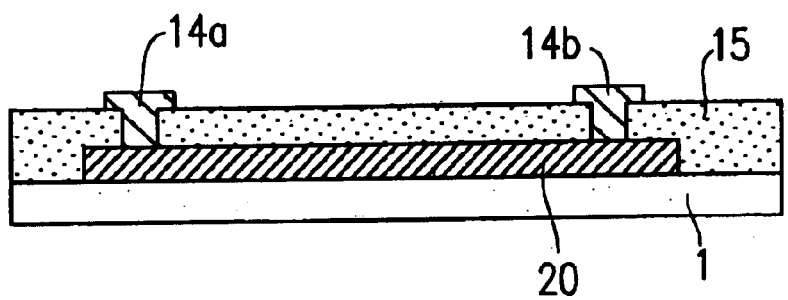
FIGS. 8A and 8B are each a cross-sectional view illustrating a structure of a built-in electronic component-mounted wiring board according to a fifth example of the present invention.
Figure 8B:
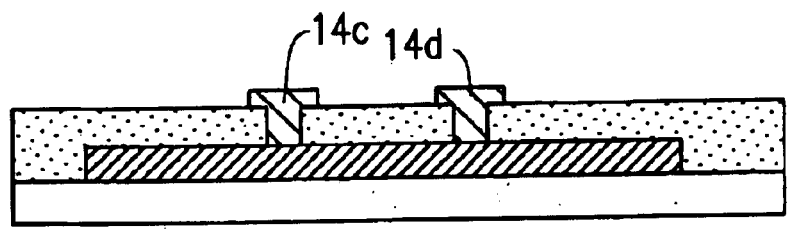

FIGS. 8A and 8B are each a cross-sectional view illustrating a structure of a built-in electronic component-mounted wiring board according to a fifth example of the present invention. The built-in electronic component-mounted wiring board includes a core 1 and a resistor 20 provided thereon as an electronic component. The resistor 20 is formed of a carbon paste pattern. In the structure shown in FIG. 8A, an insulating layer 15 is provided on the resistor 20, and wiring patterns 14a and 14b are provided on the insulating layer 15. The wiring patterns 14a and 14b are connected to the resistor 20 via openings formed in the insulating layer 15.

In the structure shown in FIG. 8B, an insulating layer 15 is provided on the resistor 20, and wiring patterns 14c and 14d are provided on the insulating layer 15. The wiring patterns 14c and 14d are connected to the resistor 20 via openings formed in the insulating layer 15.

In FIGS. 8A and 8B, the wiring pattern 14 and the electronic component (resistor) 20 are provided at different locations. In the structure shown in FIG. 8B, the connecting portions are closer to each other than in the structure shown in FIG. 8A. Therefore, the resistance between wiring patterns 14c and 14d is smaller than that between the conductive resistor between wiring patterns 14a and 14b.

In this example, the circuit constant of the resistor 20 is determined only by the position and the area of the opening formed in the insulating layer 15. Accordingly, in order to change the circuit constant of the resistor 20, it is not necessary to change the size or thickness of the resistor 20 to be printed. The connecting positions and the connecting areas between the wiring pattern and the electronic component can be easily changed by changing the position of the opaque (black) area of the photomask, the irradiation position of the laser light or the like, even during production. Accordingly, the value of the circuit constants during production can be freely changed or adjusted.

According to a conventional method of, for example, using a discrete electronic component, such as a resistor or a capacitor, in order to change the functions and characteristics of the electronic component such as a circuit constant or the like during production, it is necessary to perform an adjustment by inserting a semi-fixed resistor or to prepare in advance electronic components having different constants and use the appropriate one. In this example, by contrast, the connecting point between the electronic component and the wiring pattern can be set to be an appropriate position or area by changing the irradiation position of laser light or the like. Thus, the wiring board can be produced while adjusting the circuit constant.

EXAMPLE 6

Figure 9:
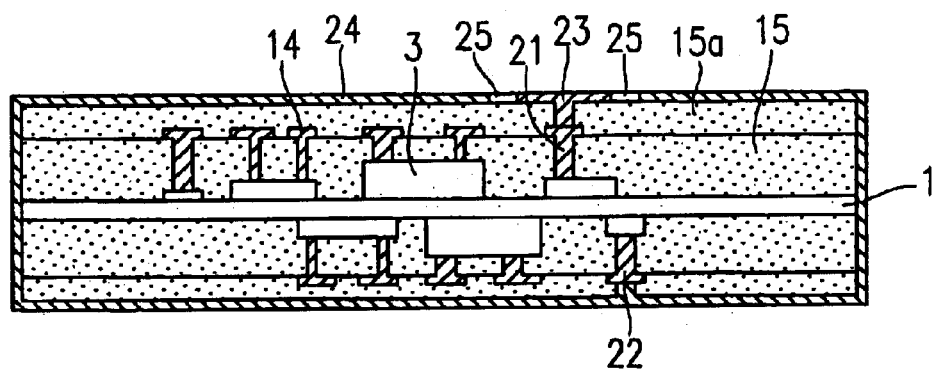
FIG. 9 is a cross-sectional view illustrating a structure of a built-in electronic component-mounted wiring board according to a sixth example of the present invention.

FIG. 9 is a cross-sectional view illustrating a structure of a built-in electronic component-mounted wiring board according to a sixth example of the present invention. The built-in electronic component-mounted wiring board includes a shield, an antenna and the like.

Conventionally, a shield structure refers to a structure in which a wiring board in a complete state is surrounded by a metal case. More specifically, each area of the wiring board corresponding to each electronic component is surrounded. The metal cases are connected to the ground. In this example, a shield layer is produced in the same step of producing a wiring pattern.

The built-in electronic component-mounted wiring board in this example is produced as follows.

As in the first example, a necessary wiring pattern is formed on both surfaces of a core 1, and an electronic component 3 is formed on both surfaces thereof.

Hereinafter, the structure on a top surface of the core 1 will be described, but the same structure is provided on a bottom surface of the core 1 unless otherwise specified. A wiring pattern 14 formed on an insulating layer 15 is electrically connected to the electronic component 3 via an opening formed in the insulating layer 15 covering the electronic component 3. An insulating layer 15a is formed so as to cover the wiring pattern 14. Portions of the insulating layer 15a above a signal line 21 which is connected to connecting terminals 23 to be connected to an external device, and portions of the insulating layer 15a below a GND line 22 are removed. The entire surface of the resultant laminate is plated or the like so as to cover the entirety of the wiring board with a metal layer. Next, the connecting terminal 23 is formed by etching. Openings 25 are formed in the metal layer in the vicinity of the connecting terminal 23 while leaving the rest of the metal layer. Thus, a shield layer 24 is formed for substantially entirely covering the wiring board. The metal layer may be connected to an antenna line (not shown) instead of the GND line 22 so as to form an antenna.

EXAMPLE 7

Figure 10:
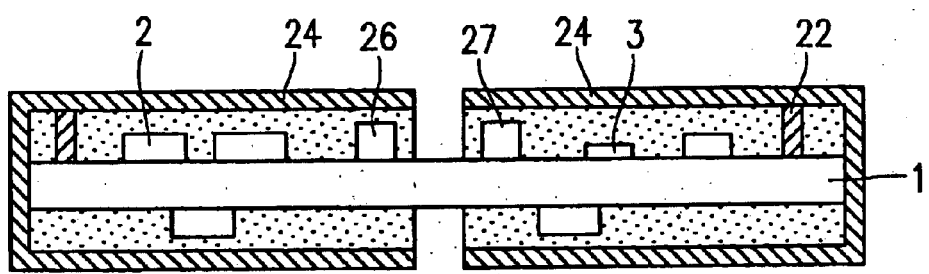
FIG. 10 is a cross-sectional view illustrating a structure of a built-in electronic component-mounted wiring board according to a seventh example of the present invention.

FIG. 10 is a cross-sectional view illustrating a built-in electronic component-mounted wiring board according to a seventh example of the present invention. Unlike in the sixth example, the built-in electronic component-mounted wiring board in the seventh example includes a shield layer 24 for each of a plurality of circuit blocks. In addition, a signal is transmitted between the circuit blocks via optical coupling of a light emitting element 26 and a light receiving element 27. Thus, the influence exerted on other circuits by external noise and noise generated in each circuit block can be minimized.

EXAMPLE 8

Figure 11:
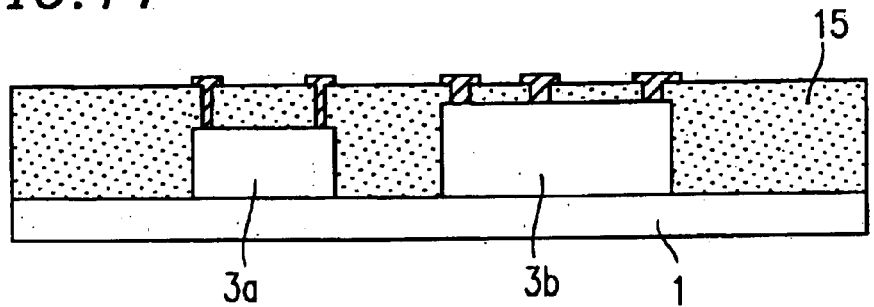
FIG. 11 is a cross-sectional view illustrating a structure of a built-in electronic component-mounted wiring board according to an eighth example of the present invention.

FIG. 11 is a cross-sectional view illustrating a structure of a built-in electronic component-mounted wiring board according to an eighth example of the present invention. The built-in electronic component-mounted wiring board in the eighth example basically has the same structure as that of the built-in electronic component-mounted wiring board 100 in the first example. In the eighth example, the core 1 is formed of a material having thermal conductivity, whereas the core 1 is a usual wiring circuit board having a multi-layer printed wiring pattern on one surface thereof.

In the eighth example, a metal plate is used for the core 1. Alternatively, a resin plate having a superb thermal conductivity, a resin plate having metal foil provided thereon, a metal plate coated with a resin, or the like can be used. Owing to such a material of the core 1, the heat generated in electronic components 3a and 3b is dissipated through the core 1, and a heat dissipation mechanism having quite a high heat dissipation efficiency is realized.

The conventional manner of attaching a heat sink to the built-in electronic component-mounted wiring board has the following problems. (1) Since electronic components are mounted at high density, it is difficult to attach a large heat sink due to interference with adjacent electronic components. (2) A built-in electronic component-mounted wiring board to which a heat sink is to be attached is often an integrated circuit package. The integrated circuit package often has lower height than the surrounding electronic components, and therefore cannot share the heat sink therewith. In the case where the heat sink is of a certain size or larger, parts for fixing the heat sink to the electronic component (for example, a claw for hooking and thus fixing the heat sink to the electronic component) is required. However, it is difficult to provide a space for such a part. In the eighth example, by contrast, the electronic components 3a and 3b having different heights or a plurality of small electronic components can be attached in close contact with one heat dissipating plate (core 1).

In this example, the heat can be generated from the electronic components 3a and 3b at high heat dissipation efficiency, as described above. In addition, the temperature of the entire built-in electronic component-mounted wiring board is made uniform, and therefore the circuit operation is stabilized.

Figure 19:
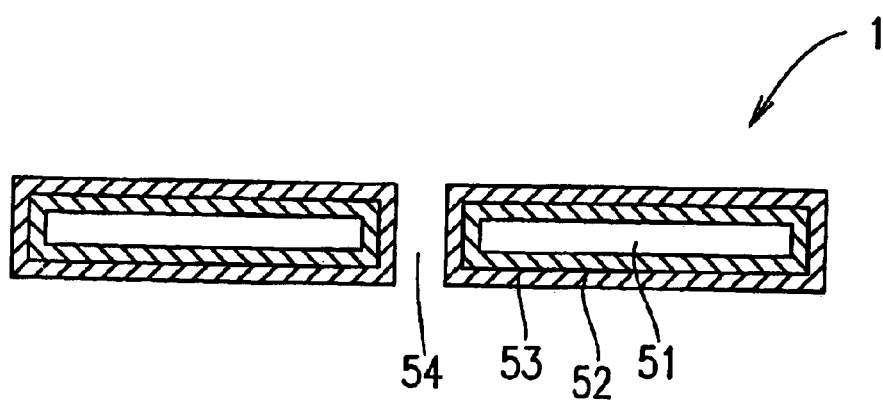
FIG. 19 is a cross-sectional view illustrating a structure of a general metal core substrate.
Figure 20:
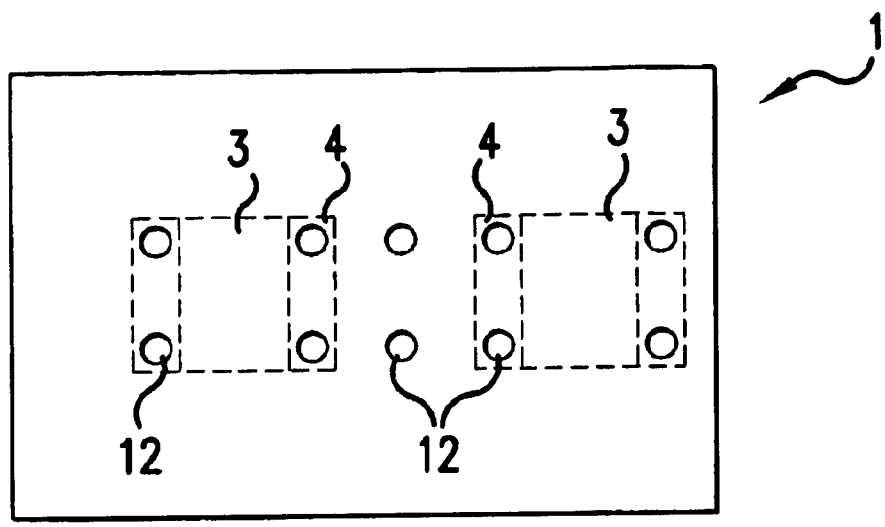
FIGS. 20 and 21 are top view of the wiring board of FIG. 1.
Figure 21:
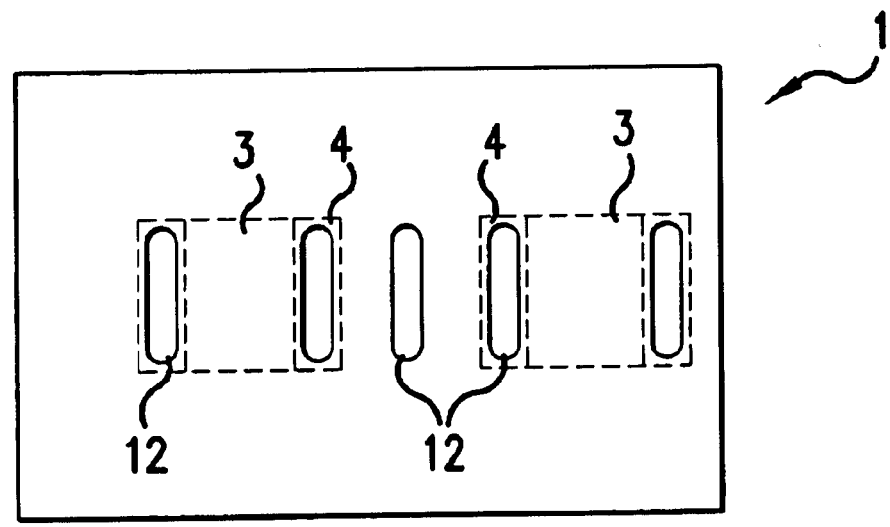

A conventional method for producing the metal core 1 will be described with reference to FIG. 19.

A conventional metal core substrate 51 is processed to have a through-hole 54. Then, the entire surface of the metal core substrate 51, including an inner wall of the through-hole 54, is covered with an insulating resin layer 52. The insulating resin layer 52 is plated so as to form a conductive layer 53. The conductive layer 53 is etched so as to form a wiring pattern.

When such a conventional metal core produced by the conventional method is used, the following steps are necessary in order to provide wiring layers in addition to the wiring layers on both surfaces of the metal core. The through-hole 54 is filled in an appropriate manner, and the steps from the plating on the insulating resin layer 52 to the formation of the wiring pattern are repeated. Alternatively, the wiring layers are formed by a build-up method. In such a case, it is necessary to form a great number of holes having a small diameter of 0.1 mm to 0.5 mm in the metal core substrate 51, which has a certain level of thickness (for example, 1 mm or more). It is also necessary to form the insulating resin layer 52 such that the through-hole 54 is not filled, and then to plate the insulating layer 52. Such processing is quite difficult. Especially, the insulating resin layer 52 is formed by applying a liquid material to the metal core substrate 51 and curing the liquid material. Therefore, the holes are filled with the liquid material, the resin does not enter the holes, or the insulating resin layer 52 at the edge of the holes is thinner than the rest of the insulating resin layer 52.

In the eighth example, by contrast, a plurality of wiring layers can be easily provided using the insulating layer 15 formed of a photosensitive resin, without forming a through-hole in a usual metal core which is difficult to be processed. Even the plurality of wiring layers do not reduce the heat dissipation efficiency.

The built-in electronic component-mounted wiring board in this example uses the metal plate or the like is used as the core 1, and thus has higher size stability, rigidity and the like than the usual wiring board. For example, a circuit board used for driving a display panel such as, for example, a liquid crystal display panel or a plasma display panel, includes several hundred to several thousand wiring patterns at a very small pitch of about 0.1 mm linearly arranged. For such a circuit board, it is very important that sizes including the entire inter-terminal size and the pitches should be highly precise. It is difficult to maintain such high size precision with a conventional wiring board including an epoxy-based resin plate as a support. The display panel and the circuit board are connected to each other by pressure-contact caused by heating. With the conventional wiring board, the linear expansion coefficient of the material of the support is larger than that of glass, which is used for the display panel. The display panel and the circuit board cannot be sufficiently connected to each other, and a stress remains after connection.

In the eighth example, the support of the wiring board is formed of a material having a small linear expansion coefficient, a temperature coefficient and the like. Owing to use of such a material, the productivity and the reliability of the electronic device can be improved.

The conventional wiring board has the following problem in terms of heat resistance. In the conventional wiring board, the material of the support is usually the same as that of the insulating layer of the wiring pattern. The electric characteristics and the like are given priority for selecting the material of the support. There is little room for selecting the material from a comprehensive point of view including the insulating property and weather resistance. There are restrictions against selecting a desirable material having, for example, high heat resistance. High heat resistance is required for preventing the support from being warped by soldering, for obtaining a sufficient peeling strength of the conductor to withstand the heating, and for preventing lead-free solder from being melted.

In the eighth example, by contrast, the support and the insulating material can be formed of different materials from each other. Therefore, a material having a sufficient strength and heat resistance, and a material having an insulating property can be selectably used for the appropriate elements.

In the case where the core 1 is formed of a conductive material such as, for example, aluminum, copper or iron, and is connected to the power supply, ground or the like, the core 1 can act as a power supply layer, a ground layer, a shield layer, or the like.

Figure 12:
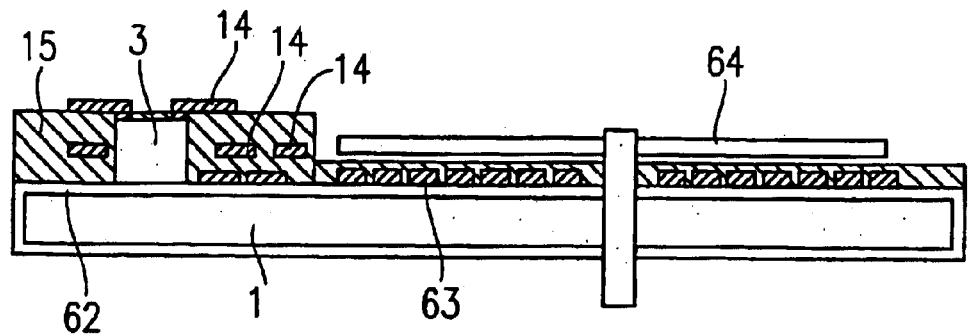
FIG. 12 is a cross-sectional view illustrating a structure of another built-in electronic component-mounted wiring board according to the eighth example of the present invention.

FIG. 12 shows a structure including a core 1 formed of a ferromagnetic material. The core 1 is covered with an insulating layer 62. A coil wiring pattern 14, an insulating layer 15 and an electronic component 3 are provided on the insulating layer 62. A coil pattern 63 and a rotor 64 are also provided on the insulating layer 62. Thus, a magnetic circuit is formed. In the case where two coil pattern are arranged so as to face each other, a transformer is formed. Since the coil pattern 63 is provided on the ferromagnetic core 1, a larger inductance is obtained than a structure including a typical printed wiring board and a similar coil pattern thereon.

With the conventional wiring board, it is difficult, for example, to mount electronic components and to provide multiple signal wiring layers. Therefore, a circuit portion is often provided on another substrate and is combined with a wiring board having electronic components thereon. In this example, it is easy to mount electronic components and to provide multiple signal wiring layers at high density. Therefore, a circuit portion can be mounted on the same support as the electronic components.

EXAMPLE 9

Figure 13:
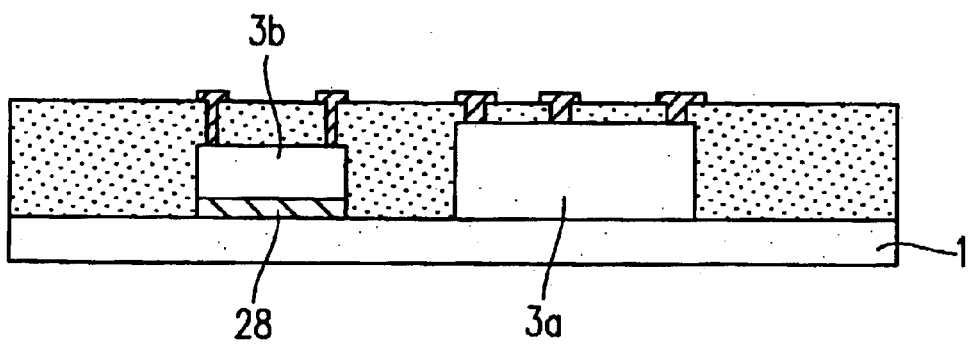
FIG. 13 is a cross-sectional view illustrating a structure of a built-in electronic component-mounted wiring board according to a ninth example of the present invention.

FIG. 13 is a cross-sectional view illustrating a built-in electronic component-mounted wiring board according to a ninth example of the present invention. The built-in electronic component-mounted wiring board in this example is similar to that of the eighth example, but is different therefrom in the manner of mounting the electronic components 3a and 3b on the core 1 (heat dissipation plate). The electronic component 3a is directly bonded to the core 1, whereas the electronic component 3b is bonded to the core 1 via a heat conduction controlling block 28 formed of a resin. Using the difference in the heat conductivity between the two electronic components 3a and 3b, the operating temperature of each electronic component is controlled so as to provide stable circuit operation.

EXAMPLE 10

Figure 14:
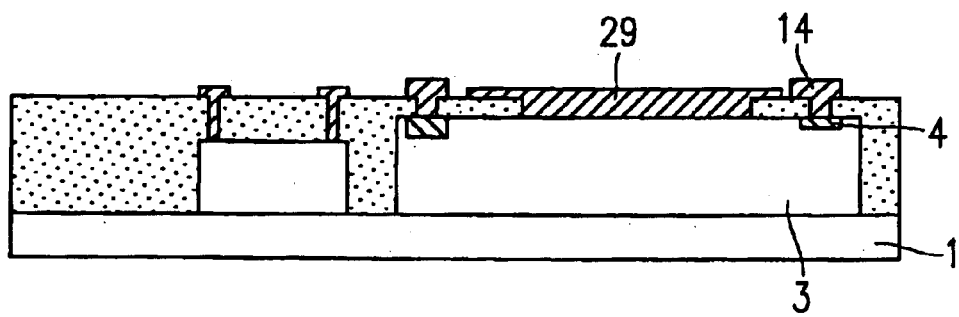
FIG. 14 is a cross-sectional view illustrating a structure of a built-in electronic component-mounted wiring board according to a tenth example of the present invention.
Figure 15:
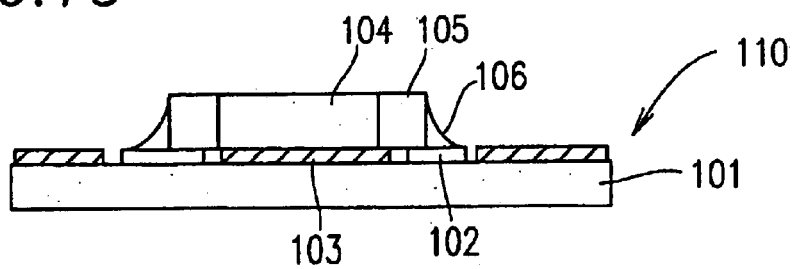
FIG. 15 is a cross-sectional view illustrating a structure of a general printing wiring board.
Figure 16:
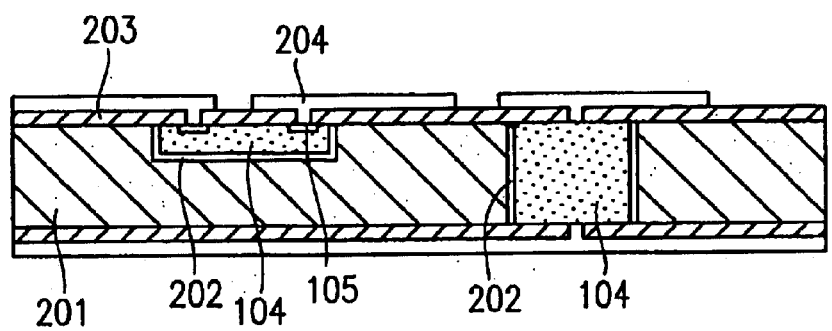
FIG. 16 is a cross-sectional view illustrating a structure of a conventional built-in electronic component-mounted wiring board.
Figure 17:
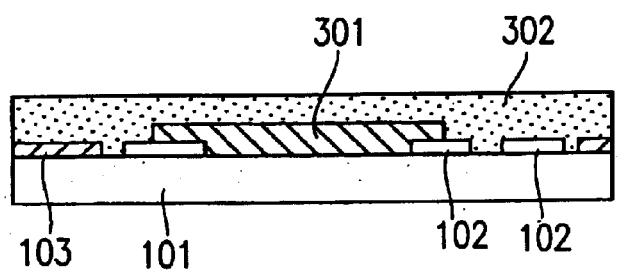
FIG. 17 is a cross-sectional view illustrating a structure of another conventional built-in electronic component-mounted wiring board.
Figure 18:
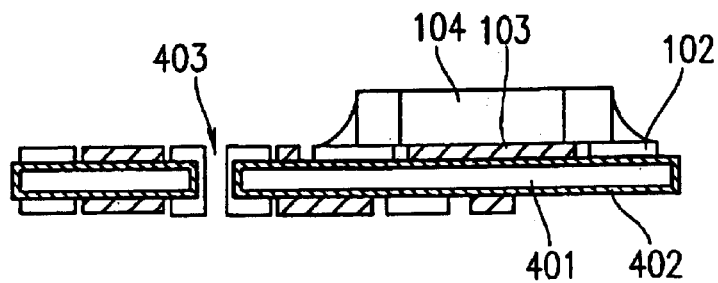
FIG. 18 is a cross-sectional view illustrating a structure of still another conventional built-in electronic component-mounted wiring board including a general metal core substrate.

FIG. 14 is a cross-sectional view illustrating a structure of a built-in electronic component-mounted wiring board according to a tenth example of the present invention. The production method and the basic structure of the built-in electronic component-mounted wiring board in the tenth example are substantially the same as those of the built-in electronic component-mounted wiring board 100 in the first example, but is different therefrom in the manner of dissipating heat from the electronic components 3.

In this example, simultaneously when the wiring pattern 14 is formed so as to be connected to the connecting terminal 4 of the electronic component 3, a conductive pattern (a heat dissipating metal layer) 29 is formed on an area of a top surface of the electronic component 3, with respect to the core 1, which is not connected to the connecting terminal 4. The heat dissipating metal layer 29 acts as a heat dissipation mechanism.

Before the formation of the heat dissipating metal layer 29, the top surface of the electronic component 3 may be surface-treated, when necessary, for the purpose of, for example, (1) promoting formation of the heat dissipating metal layer 29 and adherence of the heat dissipating metal layer 29 to the electronic component 3, (2) insulating the surface of the electronic component 3, and (3) preventing the electronic component 3 from being contaminated or damaged by being processed for forming the heat dissipating metal layer 29.

As described above in detail, according to the present invention an electronic component is partially or entirely covered with an insulating layer. Thus, an electronic component is put into a built-in state. By putting the electronic component and the wiring into a built-in state, the circuit can be formed in the form of a black box. By putting the electronic component into a built-in state or surrounding the electronic component with an insulating layer, the shock resistance thereof can be improved.

According to the present invention, a connecting portion is formed in the opening in the insulating layer by a metallizing method and then the electronic component is electrically connected to the wiring layer or another electronic component via the connecting portion. The reliability of the connection of the electronic component can be improved as compared to the case where re-heating is performed by solder reflow or the like. Environmentally hazardous materials are not used for electrically connecting an electronic component, or the amount of such materials is reduced. Therefore, hazardous effects on the environment can be reduced.

The connecting portion from the connecting terminal of the electronic component to the wiring layer can have a diameter substantially equal to or smaller than the connecting terminal. Therefore, the area required for electric connection of the electronic component can be reduced. Even an electronic component having a great number of connecting terminals can be stably connected.

According to the present invention, the position, the area and the like of the connecting portion between the wiring layer and the electronic component can be changed during production of the built-in electronic component-mounted wiring board. Therefore, the circuit constant or the like can be adjusted and thus the function and the characteristics of the electronic component can be controlled.

According to the present invention, the area for wiring below the electronic component can be used more effectively as compared to the case of the conventional art of mounting an electronic component in an accommodating section in the support. Even electronic component shaving different heights can be stably connected. Unlike the conventional art of forming an electronic component by printing, any type of electronic components can be put into a built-in state. A shield structure, an antenna and the like can be easily realized, and an efficient heat dissipation mechanism can be obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A built-in electronic component-mounted wiring board, comprising:
   an electronic component having a connecting terminal and being mounted on a support, the electronic component thereby being built-in to the support;
   an insulating layer provided partially on the support and partially on the electronic component so as to cover at least a portion of the electronic component; and
   an opening provided in the insulating layer so as to be completely encircled by the insulating layer so as to expose the connecting terminal of the electronic component.

2. A built-in electronic component-mounted wiring board according to claim 1, wherein a top surface of the insulating layer is substantially at the same level as that or lower than that of a top surface of the electronic component with respect to the support.

3. A built-in electronic component-mounted wiring board according to claim 1, wherein an area and a position of the opening in the insulating layer are set in accordance with a desired function and characteristic of the electronic component.

4. A built-in electronic component-mounted wiring board according to claim 1, further comprising a metal layer for covering a laminate including the support, the insulating layer, and the electronic component, except for a portion through which the laminate is connectable to an external device.

5. A built-in electronic component-mounted wiring board according to claim 1, further comprising a metal layer having a heat dissipating function on a laminate including the support, the insulating layer, and the electronic component except in a position of the connecting terminal.

6. A built-in electronic component-mounted wiring board according to claim 1, wherein the support is formed of a layer of a material which is different from a material of the insulating layer or a plurality of layers of a material different from the insulating layer material.

7. A built-in electronic component-mounted wiring board according to claim 6, wherein the support material is formed of a layer of a highly heat conductive material.

8. A built-in electronic component-mounted wiring board according to claim 6, wherein the support material is formed of a layer of an electrically conductive material.

9. A built-in electronic component-mounted wiring board according to claim 6, wherein the support material is formed of a layer of a ferromagnetic material.

10. A method for producing a built-in electronic component-mounted wiring board, comprising the steps of:
    mounting an electronic component on a support, the electronic component thereby being built-in to the support;
    forming an insulating layer partially on the support and partially on the component so as to cover at least a portion of the support; and
    forming an opening in the insulating layer, said opening being completely encircled by the insulating layer so as to expose a connecting terminal of the electronic component.

11. A method according to claim 10, further comprising:

the step of metallizing a laminate including the support, the insulating layer and the electronic component after the opening is formed, thereby forming a connecting portion in the opening, which is electrically connected to the connecting terminal of the electronic component, or the steps of: metallizing a laminate including the support, the insulating layer and the electronic component after the opening is formed, thereby forming a conductive layer in the opening and on the insulating layer; and etching the conductive layer, thereby forming a connecting portion in the opening and a wiring pattern which is electrically connected to the connecting terminal of the electronic component via the connecting portion.

12. A method according to claim 10, wherein the insulating layer is formed of a photosensitive material, and the opening in the insulating layer is formed by developing the insulating layer by supplying light thereto.

* * * * *